(12) United States Patent
Oinoue

(10) Patent No.: US 10,070,086 B2
(45) Date of Patent: Sep. 4, 2018

(54) SOLID-STATE IMAGING DEVICE, METHOD OF MANUFACTURING THE SAME, AND ELECTRONIC DEVICE

(71) Applicant: SONY CORPORATION, Tokyo (JP)

(72) Inventor: Takashi Oinoue, Tokyo (JP)

(73) Assignee: Sony Corporation, Tokyo (JP)

(\*) Notice: Subject to any disclaimer, the term of this patent is extended or adjusted under 35 U.S.C. 154(b) by 0 days.

(21) Appl. No.: 15/524,185

(22) PCT Filed: Oct. 29, 2015

(86) PCT No.: PCT/JP2015/080483
§ 371 (c)(1),
(2) Date: May 3, 2017

(87) PCT Pub. No.: WO2016/076125
PCT Pub. Date: May 19, 2016

(65) Prior Publication Data
US 2017/0359541 A1 Dec. 14, 2017

(30) Foreign Application Priority Data

Nov. 12, 2014 (JP) ................................. 2014-229367

(51) Int. Cl.
*H01L 27/00* (2006.01)
*H01L 31/00* (2006.01)
(Continued)

(52) U.S. Cl.
CPC ....... *H04N 5/374* (2013.01); *H01L 27/14625* (2013.01); *H01L 27/14831* (2013.01);
(Continued)

(58) Field of Classification Search
CPC ......... H01L 27/14625; H01L 27/14831; H01L 27/14627; H01L 27/14605;
(Continued)

(56) References Cited

U.S. PATENT DOCUMENTS 7,659,929 B2 * 2/2010 Sakoh ............... H01L 27/14621
348/275
8,614,494 B2 * 12/2013 Kurogi .............. H01L 27/14603
257/291
(Continued)

FOREIGN PATENT DOCUMENTS

JP    2000-260970 A    9/2000
JP    2008-235768 A    10/2008
(Continued)

OTHER PUBLICATIONS

International Search Report prepared by the Japan Patent Office dated Jan. 13, 2016, for International Application No. PCT/JP2015/080483.

*Primary Examiner* — Nikolay Yushin
(74) *Attorney, Agent, or Firm* — Sheridan Ross P.C.

(57) ABSTRACT

The present disclosure relates to a solid-state imaging device capable of receiving light entering a gap between pixel regions of imaging units by the pixel region when a plurality of imaging units is arranged, a method of manufacturing the same, and an electronic device. A CMOS image sensor includes a pixel region formed of a plurality of pixels. A convex lens is provided for each of a plurality of CMOS image sensors. A plurality of CMOS image sensors is arranged on a supporting substrate. The present disclosure is applicable to a solid-state imaging device and the like in which a plurality of CMOS image sensors is arranged on the supporting substrate, for example.

9 Claims, 7 Drawing Sheets

(51) Int. Cl.
    *H04N 5/374*     (2011.01)
    *H04N 5/345*     (2011.01)
    *H01L 27/148*     (2006.01)
    *H01L 27/146*     (2006.01)
    *H04N 5/372*     (2011.01)
    *H04N 3/14*     (2006.01)

(52) U.S. Cl.
    CPC ........... *H04N 3/1512* (2013.01); *H04N 5/345* (2013.01); *H04N 5/37206* (2013.01)

(58) Field of Classification Search
    CPC ............. H01L 27/14603; H01L 31/042; H01L 31/0543; H01L 31/02357
    See application file for complete search history.

(56) References Cited

U.S. PATENT DOCUMENTS

| | | | |
|---|---|---|---|
| 8,952,312 B2 * | 2/2015 | Blanquart | H01L 27/14601 250/208.1 |
| 2008/0230922 A1 | 9/2008 | Mochizuki et al. | |
| 2012/0241895 A1 * | 9/2012 | Kurogi | H01L 27/14603 257/437 |
| 2012/0307030 A1 * | 12/2012 | Blanquart | H01L 27/14601 348/76 |

FOREIGN PATENT DOCUMENTS

| | | |
|---|---|---|
| JP | 2010-256530 A | 11/2010 |
| JP | 2014-515955 A | 7/2014 |

\* cited by examiner

SOLID-STATE IMAGING DEVICE, METHOD OF MANUFACTURING THE SAME, AND ELECTRONIC DEVICE

CROSS REFERENCE TO RELATED APPLICATIONS

This application is a national stage application under 35 U.S.C. 371 and claims the benefit of PCT Application No. PCT/JP2015/080483 having an international filing date of 29 Oct. 2015, which designated the United States, which PCT application claimed the benefit of Japanese Patent Application No. 2014-229367 filed 12 Nov. 2014, the disclosures of which are incorporated herein by reference in their entirety.

TECHNICAL FIELD

The present disclosure relates to a solid-state imaging device, a method of manufacturing the same, and an electronic device, and especially relates to the solid-state imaging device capable of receiving light entering a gap between pixel regions of imaging units by the pixel region when a plurality of imaging units is arranged, the method of manufacturing the same, and the electronic device.

BACKGROUND ART

When a large-sized complementary metal-oxide semiconductor (CMOS) image sensor (CIS) is formed of a single chip, a yield is decreased because of poor obtaining efficiency of a chip from a wafer. Therefore, it is considered to improve productivity of the large-sized CIS by tiling a plurality of small-sized CISs each of which is formed of a single chip and electrically connecting them by wire bonding to manufacture the large-sized CIS (for example, refer to Patent Document 1).

However, there is a large gap (connection) of the order of millimeters due to the wire bonding between the small-sized CISs included in the large-sized CIS manufactured in this manner, and it is not possible to receive the light entering the gap by the small-sized CIS. Therefore, in order to generate one imaged image having a size corresponding to the large-sized CIS, it is required to generate an image corresponding to the light entering the gap by performing image processing such as interpolation by using the image imaged by each of the small-sized CISs, so that there is a large load in image processing. Therefore, it is difficult to generate the imaged image at high resolution and high frame rate having the size corresponding to the large-sized CIS, and such large-sized CIS is not suitable for imaging application.

CITATION LIST

Patent Document

Patent Document 1: Japanese Patent Application Laid-Open No. 2008-235768

SUMMARY OF THE INVENTION

Problems to be Solved by the Invention

Therefore, it is required to decrease a load of image processing by enabling a pixel region to receive light entering a gap between pixel regions of small-sized CISs when manufacturing a large-sized CIS by tiling the small-sized CISs.

The present disclosure is achieved in view of such a condition and an object thereof is to receive the light entering the gap between the pixel regions of the imaging units by the pixel region when a plurality of imaging units is arranged.

Solutions to Problems

A solid-state imaging device according to a first aspect of the present disclosure is a solid-state imaging device including a plurality of imaging units each including a pixel region formed of a plurality of pixels, a first lens provided for each of the plurality of imaging units, and a supporting substrate on which the plurality of imaging units is arranged.

According to the first aspect of the present disclosure, a plurality of imaging units each including the pixel region formed of a plurality of pixels, the first lens provided for each of the plurality of imaging units, and the supporting substrate on which the plurality of imaging units is arranged are provided.

A method of manufacturing according to a second aspect of the present disclosure is a method of manufacturing a solid-state imaging device including forming a solid-state imaging device including a plurality of imaging units each including a pixel region formed of a plurality of pixels, a first lens provided for each of the plurality of imaging units, and a supporting substrate on which the plurality of imaging units is arranged.

According to the second aspect of the present disclosure, the solid-state imaging device provided with a plurality of imaging units each including a pixel region formed of a plurality of pixels, the first lens provided for each of the plurality of imaging units, and the supporting substrate on which the plurality of imaging units is arranged is formed.

An electronic device according to a third aspect of the present disclosure is an electronic device including a plurality of imaging units each including a pixel region formed of a plurality of pixels, the first lens provided for each of the plurality of imaging units, and the supporting substrate on which the plurality of imaging units is arranged.

According to the third aspect of the present disclosure, a plurality of imaging units each including the pixel region formed of a plurality of pixels, the first lens provided for each of the plurality of imaging units, and the supporting substrate on which the plurality of imaging units is arranged are provided.

Effects of the Invention

According to first and third aspects of the present disclosure, it is possible to image. Also, according to the first and third aspects of the present disclosure, it is possible to receive light entering a gap between pixel regions of imaging units by the pixel region when a plurality of imaging units is arranged.

Also, according to a second aspect of the present disclosure, it is possible to form a solid-state imaging device. Furthermore, according to the second aspect of the present disclosure, it is possible to form the solid-state imaging device capable of receiving the light entering the gap between the pixel regions of the imaging units by the pixel region when a plurality of imaging units is arranged.

Meanwhile, the effect is not necessarily limited to the effect herein described and may be any of the effects described in the present disclosure.

MODE FOR CARRYING OUT THE INVENTION

A mode for carrying out the present disclosure (hereinafter, referred to as an embodiment) is hereinafter described. Meanwhile, the description is given in the following order.
1. First Embodiment: Solid-state Imaging Device (FIGS. 1 to 5)
2. Second Embodiment: Solid-state Imaging Device (FIG. 6)
3. Third Embodiment: Imaging Device (FIG. 7)

First Embodiment (Configuration Example of First Embodiment of Solid-State Imaging Device)

Figure 1:
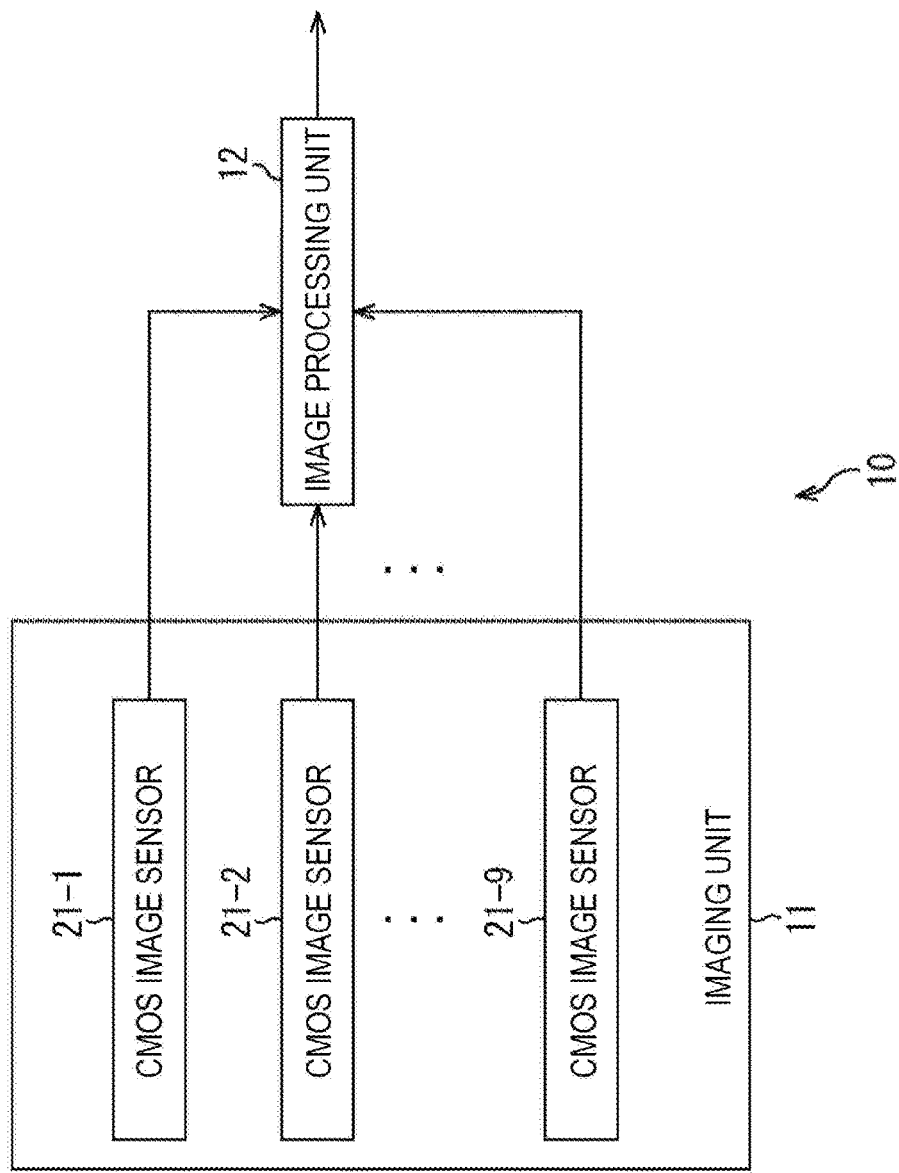
FIG. 1 is a block diagram illustrating a configuration example of a first embodiment of a solid-state imaging device to which the present disclosure is applied.

FIG. 1 is a block diagram illustrating a configuration example of a first embodiment of a solid-state imaging device to which the present disclosure is applied.

A solid-state imaging device 10 in FIG. 1 formed of an imaging unit 11 and an image processing unit 12 images an image having a relatively large size.

Specifically, the imaging unit 11 of the solid-state imaging device 10 is formed of nine CMOS image sensors 21-1 to 21-9 arranged in a two-dimensional manner to form a matrix, the CMOS image sensors each of which images an image having a size obtained by dividing the size of the image imaged by the solid-state imaging device 10 into nine, for example. In this manner, the imaging unit 11 is formed of small-sized nine CMOS image sensors 21-1 to 21-9, so that productivity of the imaging unit 11 is improved as compared to that of the imaging unit formed of a large-sized CMOS image sensor which images an image having a size of the image imaged by the solid-state imaging device 10.

Meanwhile, hereinafter, when it is not required to especially distinguish the CMOS image sensors 21-1 to 21-9 from one another, they are collectively referred to as the CMOS image sensors 21. Each of the nine CMOS image sensors 21 images and supplies an imaged image obtained as a result to the image processing unit 12.

The image processing unit 12 interpolates an imaged image corresponding to light which enters a gap in a horizontal direction and in a vertical direction between the CMOS image sensors 21 and is not received by the CMOS image sensor 21 by using the imaged image supplied from the CMOS image sensor 21. According to this, the image processing unit 12 generates one imaged image having a size corresponding to the imaging unit 11. The image processing unit 12 outputs one generated imaged image.

(Configuration Example of CMOS Image Sensor)

Figure 2:
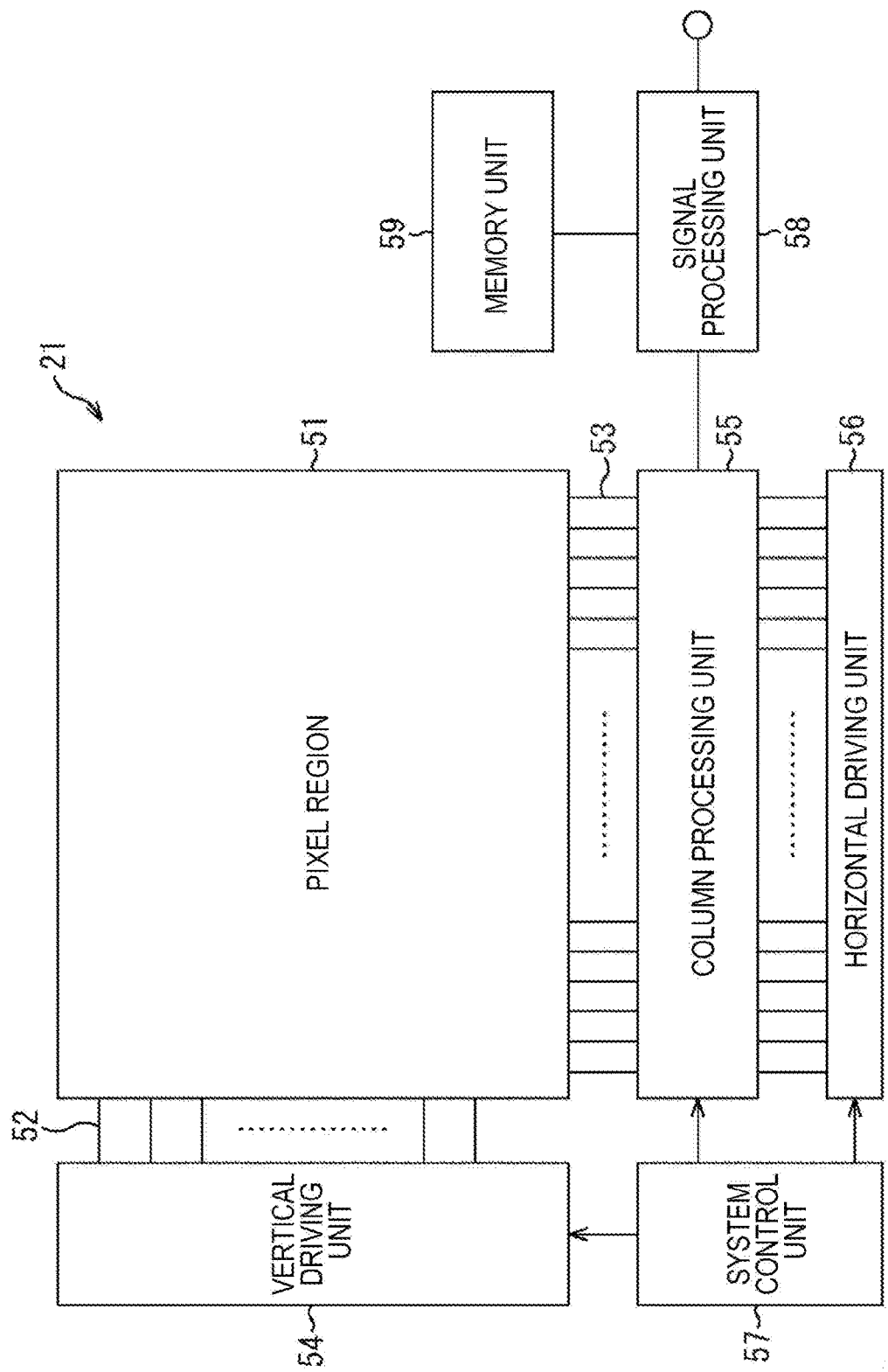
FIG. 2 is a view illustrating a configuration example of a CMOS image sensor in FIG. 1.

FIG. 2 is a view illustrating a configuration example of the CMOS image sensor 21 in FIG. 1.

The CMOS image sensor 21 (imaging unit) includes a pixel region 51, a pixel driving line 52, a vertical signal line 53, a vertical driving unit 54, a column processing unit 55, a horizontal driving unit 56, a system control unit 57, a signal processing unit 58, and a memory unit 59 formed on a semiconductor substrate (chip) such as a silicon substrate not illustrated.

In the pixel region 51 of the CMOS image sensor 21, a plurality of pixels each including a photoelectric conversion element which generates a charge having a charge amount according to an incident light amount to accumulate therein is arranged in a two-dimensional manner to form a matrix to image. Also, in the pixel region 51, the pixel driving line 52 is formed for each row of the pixels of the matrix and the vertical signal line 53 is formed for each column.

The vertical driving unit 54 formed of a shift register, an address decoder and the like drives the pixels in the pixel region 51 row by row, for example. One end of the pixel driving line 52 is connected to an output terminal not illustrated corresponding to each row of the vertical driving unit 54. Although a specific configuration of the vertical driving unit 54 is not illustrated, the vertical driving unit 54 has a configuration including two scanning systems: a read scanning system and a sweep scanning system.

The read scanning system sequentially selects the respective rows for sequentially reading pixel signals from the pixels row by row and outputs a selection signal and the like from the output terminal connected to the pixel driving line 52 of the selected row. According to this, electrical signals of the charges accumulated in the photoelectric conversion elements of the pixels of the row selected by the read scanning system are read as the pixel signals to be supplied to the vertical signal line 53.

In order to sweep an unnecessary charge from the photoelectric conversion element (to reset), the sweep scanning system outputs a reset signal from the output terminal connected to the pixel driving line 52 of each row only time equivalent to a shutter speed earlier than the scanning performed by the reading system. So-called electronic shutter operation is sequentially performed for each row by the scanning performed by the sweep scanning system. Herein, the electronic shutter operation is intended to mean operation to discharge the charge of the photoelectric conversion element and newly start exposing (start accumulating charges).

The column processing unit 55 includes a signal processing circuit for each column of the pixel region 51. Each signal processing circuit of the column processing unit 55 performs denoising such as correlated double sampling (CDS) processing and signal processing such as an A/D conversion process on the pixel signal output from each pixel of the selected row through the vertical signal lines 53. The column processing unit 55 temporarily holds the pixel signals subjected to the signal processing.

The horizontal driving unit 56 formed of a shift register, an address decoder and the like sequentially selects the signal processing circuits of the column processing unit 55. According to selective scanning by the horizontal driving unit 56, the pixel signals subjected to the signal processing by the respective signal processing circuits of the column processing unit 55 are sequentially output to the signal processing unit 58.

The system control unit 57 formed of a timing generator which generates various timing signals and the like controls the vertical driving unit 54, the column processing unit 55, and the horizontal driving unit 56 on the basis of the various timing signals generated by the timing generator.

The signal processing unit 58 has at least an addition processing function. The signal processing unit 58 performs various types of signal processing such as addition processing on the pixel signal output from the column processing unit 55. At that time, the signal processing unit 58 stores a halfway result of the signal processing and the like in the memory unit 59 as necessary and refers to the same when necessary. The signal processing unit 58 supplies the pixel signal subjected to the signal processing to the image processing unit 12 in FIG. 1 as the imaged image.

The memory unit 59 is formed of a dynamic random access memory (DRAM), a static random access memory (SRAM) and the like.

The vertical driving units 54, the horizontal driving units 56 and the like of the nine CMOS image sensors 21 configured in the above-described manner are electrically connected. Then, it is controlled such that the same rows of the CMOS image sensors 21 arranged in the horizontal direction are simultaneously selected and the pixel signals are sequentially output from the pixel on a left end of the leftmost CMOS image sensor 21 of the selected rows.

(Structure Example of Imaging Unit)

Figure 3:
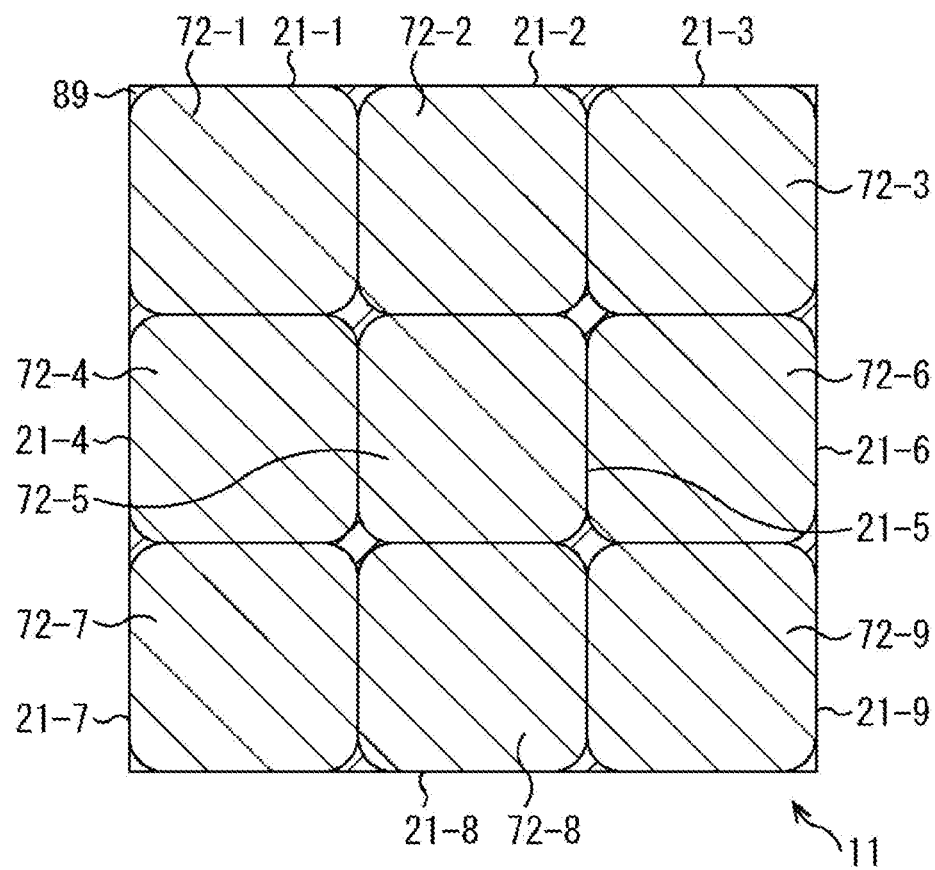
FIG. 3 is an upper view illustrating a structure example of an imaging unit.
Figure 4:
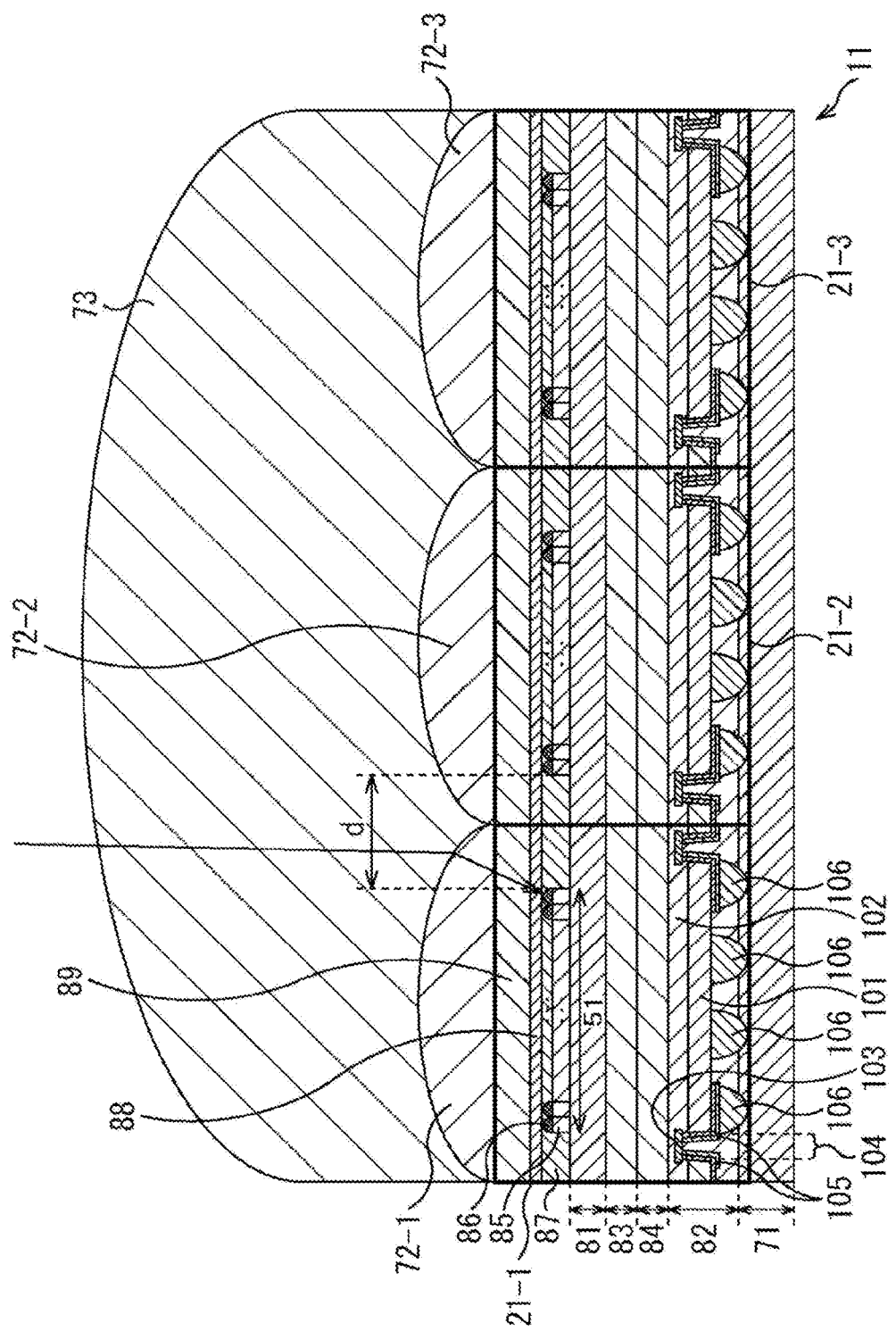
FIG. 4 is a cross-sectional view illustrating the structure example of the imaging unit.

FIG. 3 is an upper view illustrating a structure example of the imaging unit 11 and FIG. 4 is a cross-sectional view illustrating the structure example of the imaging unit 11.

As illustrated in FIG. 4, a supporting substrate 71 is provided on the imaging unit 11. A total of nine CMOS image sensors 21-1 to 21-9, three in the horizontal direction and three in the vertical direction of the supporting substrate 71, are arranged on the supporting substrate 71 as illustrated in FIG. 3. Convex lenses 72-1 to 72-9 (first lenses) designed to condense the light entering the gap between the pixel regions 51 of the CMOS image sensors 21 on the pixel region 51 are formed on the CMOS image sensors 21-1 to 21-9, respectively. Meanwhile, hereinafter, when it is not necessary to especially distinguish the convex lenses 72-1 to 72-9 from one another, they are collectively referred to as the convex lenses 72.

The CMOS image sensor 21 is a chip size package (CSP) of a rear surface irradiation type and stacked type CMOS image sensor, for example. Specifically, the CMOS image sensor 21 is formed of a sensor substrate 81 being a semiconductor substrate on which the pixel region 51 is formed and a circuit substrate 82 being a semiconductor substrate on which each unit other than the pixel region 51 is formed as the circuit for controlling imaging. Then, the sensor substrate 81 and the circuit substrate 82 are stacked such that a wiring layer 83 provided on a surface (surface) opposite to a light irradiation surface (rear surface) of the sensor substrate 81 joins a wiring layer 84 provided on one surface of the circuit substrate 82.

Also, a color filter 85 is provided for each pixel on the pixel region 51 on the sensor substrate 81 and an on-chip lens 86 (pixel lens) is formed on a rear surface side of the color filter 85. The on-chip lens 86 is planarized by a planarizing film 87 and a glass substrate 89 as a protecting substrate to protect the on-chip lens 86 is joined to a rear surface side of the planarizing film 87 through a sealing resin 88.

A SiO2 layer 102 and the like is formed on a rear surface side of a supporting substrate 101 such as a silicon substrate to form the circuit substrate 82. An AL pad 103 is embedded in the SiO2 layer 102 and a through silicon via (TSV) 104 having the AL pad 103 as a bottom is formed on the SiO2 layer 102 and the supporting substrate 101. Also, metal wiring 105 is formed so as to cover an inner surface of the TSV 104 and a bump 106 is formed on the metal wiring 105. The CMOS image sensor 21 is arranged on the supporting substrate 71 through the bump 106.

A lens 73 (overall lens) is formed for all of the nine CMOS image sensors 21 on a rear surface side of the convex lenses 72 of the nine CMOS image sensors 21. Meanwhile, the lens 73 is not illustrated in FIG. 3 for the purpose of description.

Since the convex lens 72 is formed on a rear surface side of each CMOS image sensor 21 in the above-described manner, the light entering a gap d between the pixel regions 51 of the CMOS image sensors 21 through the lens 73 is refracted by the convex lens 72 to enter the pixel region 51. Therefore, the CMOS image sensor 21 may image an image corresponding to the light entering the gap d.

Meanwhile, the convex lens 72, the lens 73, and the on-chip lens 86 may be formed of an organic resin or an inorganic material.

(Method of Manufacturing Imaging Unit)

Figure 5:
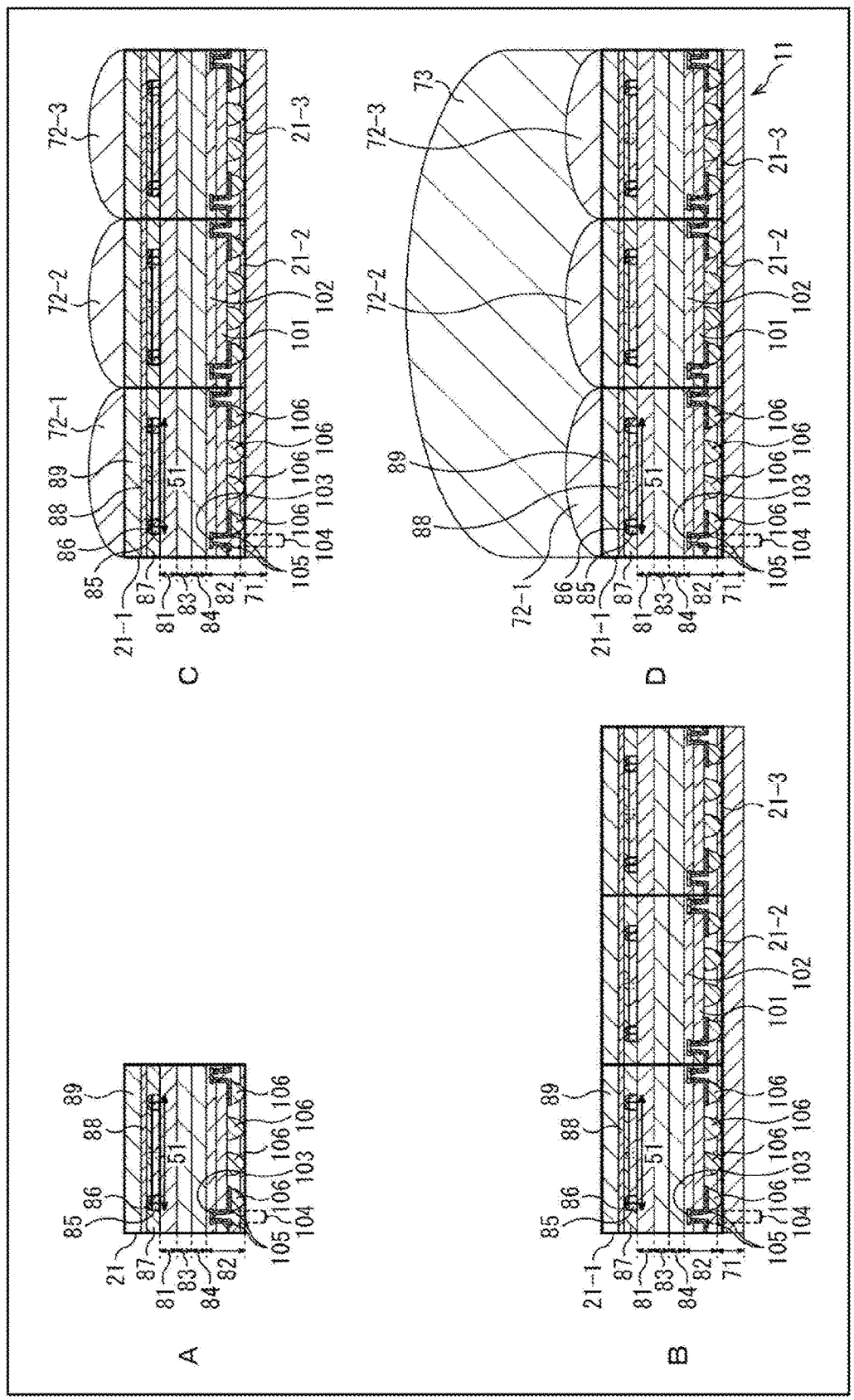
FIG. 5 is a cross-sectional view illustrating a method of manufacturing the imaging unit.

FIG. 5 is a cross-sectional view illustrating a method of manufacturing the imaging unit 11.

As illustrated in A of FIG. 5, the nine CMOS image sensors 21 are first manufactured for the CMOS image sensors 21, respectively, to be polished. Next, as illustrated in B of FIG. 5, the nine CMOS image sensors 21 are tiled (arranged) on the supporting substrate 71.

Thereafter, as illustrated in C of FIG. 5, the convex lenses 72 are formed on the nine CMOS image sensors 21, respectively, by lithography, imprinting, casting and the like. Finally, as illustrated in D of FIG. 5, the lens 73 is formed for all the nine CMOS image sensors 21-1 to 21-9 on the rear surface side of the convex lens 72, and according to this, the imaging unit 11 is completely manufactured.

As described above, the CMOS image sensor 21 is the CSP. According to this, the gap between the CMOS image sensors 21 is downsized as compared to a case in which the CMOS image sensors 21 are electrically connected to one another by wire bonding and a width of the gap d between the pixel regions 51 of the CMOS image sensors 21 is of the order of 100 micrometers. Also, each CMOS image sensor 21 is polished. According to this, a distance between an end face of the CMOS image sensor 21 and the pixel region 51 is shortened and the width of the gap d is of the order of tens of micrometers.

Furthermore, the lens 72 is formed on the rear surface side of each CMOS image sensor 21. According to this, it is possible to receive the light entering the gap d by the pixel region 51. As a result, a width of a region which cannot be imaged by any CMOS image sensor 21 out of the gap d is of the order of micrometers.

In this manner, the width of the region which cannot be imaged by any CMOS image sensor 21 is small in the imaging unit 11, so that interpolation by the image processing unit 12 is easy. As a result, the solid-state imaging device 10 may generate the imaged image at high resolution and high frame rate of the size corresponding to the imaging unit 11.

Second Embodiment (Structure Example of Imaging Unit of Second Embodiment of Solid-State Imaging Device)

A second embodiment of a solid-state imaging device to which the present disclosure is applied is the same as the first embodiment except a structure of an imaging unit 11. Therefore, only the structure of the imaging unit 11 of the second embodiment is hereinafter described.

Figure 6:
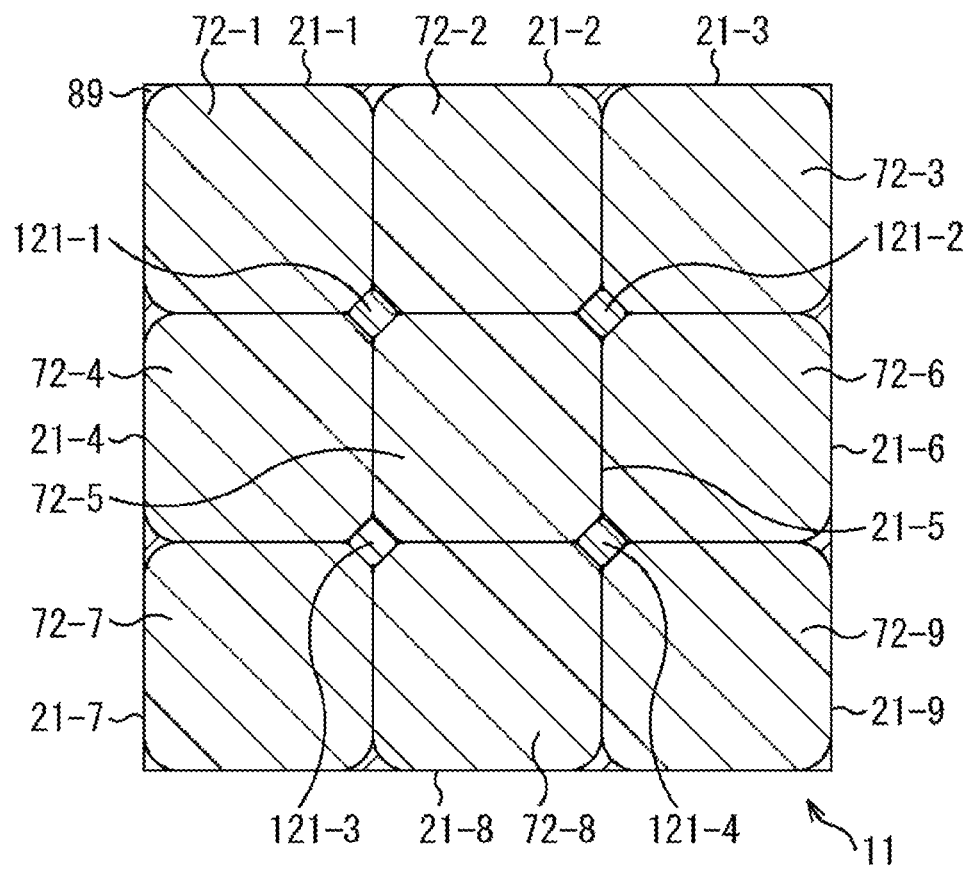
FIG. 6 is an upper view illustrating a structure example of an imaging unit of a second embodiment of a solid-state imaging device to which the present disclosure is applied.
Figure 7:
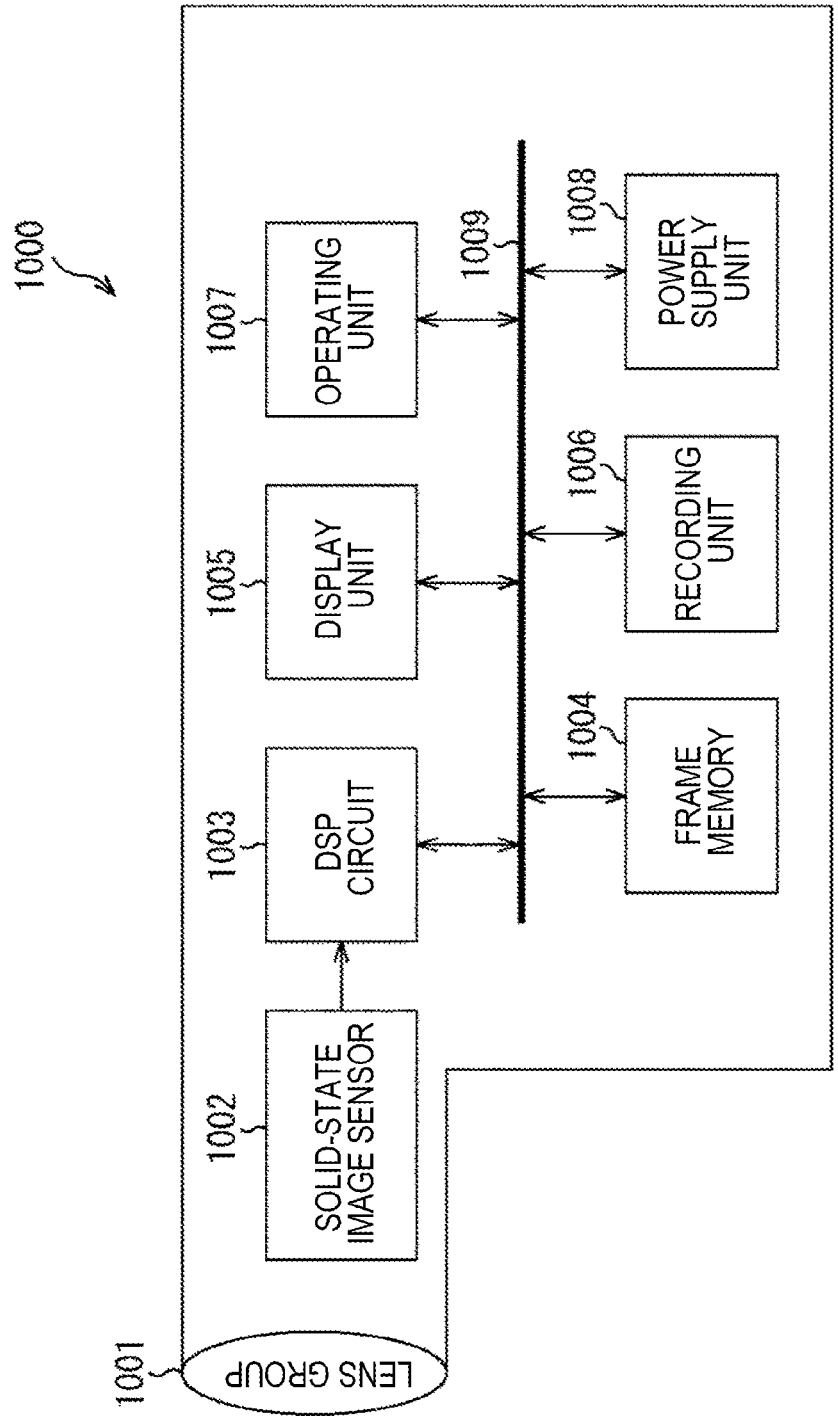
FIG. 7 is a block diagram illustrating a configuration example of an imaging device as an electronic device to which the present disclosure is applied.

FIG. 6 is an upper view illustrating a structure example of the imaging unit 11 of the second embodiment of the solid-state imaging device to which the present disclosure is applied.

Meanwhile, a lens 73 is not illustrated in FIG. 6 as in FIG. 3 for the purpose of description.

As illustrated in FIG. 6, the structure of the imaging unit 11 of the second embodiment is different from the structure of the imaging unit 11 of the first embodiment in that concave second lenses 121-1 to 121-4 are provided on intersections of four convex first 72 forming two by two arrangement, respectively.

Specifically, the concave second lens 121-1 is provided on the intersection of four convex first lenses 72-1, 72-2, 72-4, and 72-5 arranged for four CMOS image sensors 21-1, 21-2, 21-4, and 21-5, two CMOS image sensors arranged in a horizontal direction and two CMOS image sensors arranged in a vertical direction of a supporting substrate 71.

Also the concave second lens 121-2 is provided on the intersection of four convex first lenses 72-2, 72-3, 72-5, and 72-6 arranged for four CMOS image sensors 21-2, 21-3, 21-5, and 21-6, two CMOS image sensors arranged in the horizontal direction and two CMOS image sensors arranged in the vertical direction of the supporting substrate 71.

Furthermore, the concave second lens 121-3 is provided on the intersection of four convex first lenses 72-4, 72-5, 72-7, and 72-8 arranged for four CMOS image sensors 21-4, 21-5, 21-7, and 21-8, two CMOS image sensors arranged in the horizontal direction and two CMOS image sensors arranged in the vertical direction of the supporting substrate 71.

Also the concave second lens 121-4 is provided on the intersection of four convex first lenses 72-5, 72-6, 72-8, and 72-9 arranged for four CMOS image sensors 21-5, 21-6, 21-8, and 21-9, two CMOS image sensors arranged in the horizontal direction and two CMOS image sensors arranged in the vertical direction of the supporting substrate 71.

As described above, the concave second lenses 121-1 to 121-4 are formed on respective intersections of the four convex first lenses 72 in the imaging unit 11 of the second embodiment, so that the light entering the intersection is refracted toward the pixel region 51. As a result, the region which cannot be imaged by any CMOS image sensor 21 out of the gap d is further decreased.

Third Embodiment (Configuration Example of One Embodiment of Imaging Device)

FIG. 7 is a block diagram illustrating a configuration example of one embodiment of an imaging device as an electronic device to which the present disclosure is applied.

An imaging device 1000 in FIG. 7 is a video camera, a digital still camera and the like. The imaging device 1000 is formed of a lens group 1001, a solid-state image sensor 1002, a DSP circuit 1003, a frame memory 1004, a display unit 1005, a recording unit 1006, an operating unit 1007, and a power supply unit 1008. The DSP circuit 1003, the frame memory 1004, the display unit 1005, the recording unit 1006, the operating unit 1007, and the power supply unit 1008 are connected to one another via a bus line 1009.

The lens group 1001 captures incident light (image light) from an object and forms an image on an imaging surface of the solid-state image sensor 1002. The solid-state image sensor 1002 is formed of the above-described imaging unit 11. The solid-state image sensor 1002 converts an amount of the incident light the image of which is formed on the imaging surface by the lens group 1001 to an electrical signal for each pixel to supply to the DSP circuit 1003 as an imaged image.

The DSP circuit 1003 serves as an image processing unit 12, for example. The DSP circuit 1003 performs image processing such as interpolation on the imaged image supplied from the solid-state image sensor 1002 and supplies the imaged image subjected to the image processing to the frame memory 1004 for each frame to temporarily store.

The display unit 1005 formed of a panel display device such as a liquid crystal panel and an organic electro luminescence (EL) panel, for example, displays the imaged image for each frame temporarily stored in the frame memory 1004.

The recording unit 1006 formed of a digital versatile disk (DVD), a flash memory and the like reads the imaged image for each frame temporarily stored in the frame memory 1004 to record.

The operating unit 1007 issues an operation command regarding various functions of the imaging device 1000 under operation by a user. The power supply unit 1008 appropriately supplies power to the DSP circuit 1003, the frame memory 1004, the display unit 1005, the recording unit 1006, and the operating unit 1007.

It is sufficient that the electronic device to which the present technology is applied is a device in which the imaging unit 11 is used as an image capturing unit (photoelectric converting unit); there is a portable terminal device having an imaging function, a copying machine using a CMOS image sensor as an image reading unit and the like in addition to the imaging device 1000.

Meanwhile, the effect described in this specification is illustrative only; the effect is not limited thereto and there may also be another effect.

Also, the embodiment of the present disclosure is not limited to the above-described embodiments and various modifications may be made without departing from the gist of the present disclosure.

For example, a CMOS image sensor 21 may also be a charge coupled device (CCD) image sensor. The CMOS image sensor 21 may also image an image of different application for each CMOS image sensor 21. Furthermore, it is sufficient that the number of the CMOS image sensors 21 forming the imaging unit 11 is two or more; this is not limited to nine.

It is also possible to configure such that a glass substrate 89 is not formed on a planarizing film 87 through a sealing resin 88 in a CSP of the CMOS image sensor 21. In this case, after the CSPs of the nine CMOS image sensors 21 are tiled on the supporting substrate 71, the sealing resin 88 is formed for all the planarizing films 87 of the nine CMOS image sensors 21 and the glass substrate 89 is joined through the sealing resin 88.

Meanwhile, the present disclosure may also have the following configuration.

(1)

A solid-state imaging device including:

a plurality of imaging units each including a pixel region formed of a plurality of pixels;

a first lens provided for each of the plurality of imaging units; and a supporting substrate on which the plurality of imaging units is arranged.

(2)

The solid-state imaging device according to (1) described above, wherein the first lens is a convex lens.

(3)

The solid-state imaging device according to (1) or (2) described above, further including:

a second lens provided on an intersection of four first lenses provided for four imaging units, two imaging units arranged in a horizontal direction and two imaging units arranged in a vertical direction of the supporting substrate.

(4)

The solid-state imaging device according to (3) described above, wherein the second lens is a concave lens.

(5)

The solid-state imaging device according to any one of (1) to (4) described above, wherein each of the plurality of imaging units is arranged on the supporting substrate through a bump.

(6)

The solid-state imaging device according to (5) described above, wherein each of the plurality of imaging units is formed of a sensor substrate including the pixel region and a circuit substrate including a circuit which controls imaging stacked on each other, and each of the plurality of imaging units is arranged on the supporting substrate through the bump provided on the circuit substrate.

(7)

The solid-state imaging device according to any one of (1) to (6), further including:

an overall lens provided for all of the plurality of imaging units.

(8)

The solid-state imaging device according to any one of (1) to (7) described above, further including:

a pixel lens provided for each of the plurality of pixels.

(9)

A method of manufacturing a solid-state imaging device including forming a solid-state imaging device including:

a plurality of imaging units each including a pixel region formed of a plurality of pixels;

a first lens provided for each of the plurality of imaging units; and a supporting substrate on which the plurality of imaging units is arranged.

(10)

An electronic device including:

a plurality of imaging units each including a pixel region formed of a plurality of pixels;

a first lens provided for each of the plurality of imaging units; and a supporting substrate on which the plurality of imaging units is arranged.

REFERENCE SIGNS LIST

10 Solid-state imaging device
21-1 to 21-9 CMOS image sensor
51 Pixel region
71 Supporting substrate
72-1 to 72-9 Convex lens
73 Lens
81 Sensor substrate
82 Circuit substrate
86 On-chip lens
106 Bump
121-1 to 121-4 Concave lens
1000 Imaging device

What is claimed is:

1. A solid-state imaging device comprising:
    a plurality of imaging units each including a pixel region formed of a plurality of pixels;
    a first lens provided for each of the plurality of imaging units;
    a supporting substrate on which the plurality of imaging units is arranged; and
    a second lens provided on an intersection of four first lenses provide for four of the plurality of imaging units.

2. The solid-state imaging device according to claim 1, wherein
    the first lens is a convex lens.

3. The solid-state imaging device according to claim 1, wherein
    the second lens is a concave lens.

4. The solid-state imaging device according to claim 1, further comprising:
    an overall lens provided for all of the plurality of imaging units.

5. The solid-state imaging device according to claim 1, further comprising:
    a pixel lens provided for each of the plurality of pixels.

6. The solid-state imaging device according to claim 1, wherein
    each of the plurality of imaging units is arranged on the supporting substrate through a bump.

7. The solid-state imaging device according to claim 6, wherein
    each of the plurality of imaging units is formed of a sensor substrate including the pixel region and a circuit substrate including a circuit which controls imaging stacked on each other, and
    each of the plurality of imaging units is arranged on the supporting substrate through the bump provided on the circuit substrate.

8. A method of manufacturing a solid-state imaging device comprising
    forming a solid-state imaging device including:
    a plurality of imaging units each including a pixel region formed of a plurality of pixels;
    a first lens provided for each of the plurality of imaging units;
    a supporting substrate on which the plurality of imaging units is arranged; and
    a second lens provided on an intersection of four first lenses provided for four of the plurality of imaging units.

9. An electronic device comprising:
    a plurality of imaging units each including a pixel region formed of a plurality of pixels;
    a first lens provided for each of the plurality of imaging units;
    a supporting substrate on which the plurality of imaging units is arranged; and
    a second lens provided on an intersection of four first lenses provided for four of the plurality of imaging units.

* * * * *